US010049845B2

(12) United States Patent
Eid (10) Patent No.: US 10,049,845 B2
(45) Date of Patent: Aug. 14, 2018

(54) CIRCUIT BOARD ENCLOSURE WITH SECURITY FEATURES PREVENTING DISASSEMBLY OR DISENGAGEMENT

(71) Applicant: Gilbert Eid, Kahhaleh (LB)

(72) Inventor: Gilbert Eid, Kahhaleh (LB)

( * ) Notice: Subject to any disclaimer, the term of this patent is extended or adjusted under 35 U.S.C. 154(b) by 184 days.

(21) Appl. No.: 15/170,908

(22) Filed: Jun. 1, 2016

(65) Prior Publication Data

US 2017/0352513 A1    Dec. 7, 2017

(51) Int. Cl.
| | |
|---|---|
| *H01H 71/02* | (2006.01) |
| *H01H 1/58* | (2006.01) |
| *H05K 1/18* | (2006.01) |
| *H05K 5/02* | (2006.01) |
| *H05K 1/02* | (2006.01) |

(52) U.S. Cl.
CPC .......... *H01H 71/02* (2013.01); *H01H 1/5805* (2013.01); *H05K 1/18* (2013.01); *H05K 5/0208* (2013.01); *H01H 2071/0292* (2013.01); *H05K 1/0275* (2013.01); *H05K 2201/09127* (2013.01)

(58) Field of Classification Search
USPC .......................... 361/748, 720; 174/250, 260
See application file for complete search history.

(56) References Cited

U.S. PATENT DOCUMENTS

| | | | | |
|---|---|---|---|---|
| 2012/0287672 A1* | 11/2012 | Lee | .................. | G02F 1/133608 362/609 |
| 2015/0130567 A1* | 5/2015 | Jang | ....................... | H01H 71/74 335/21 |
| 2015/0362668 A1* | 12/2015 | McDonald | ........... | G02B 6/0096 362/555 |

* cited by examiner

*Primary Examiner* — Andargie M Aychillhum
(74) *Attorney, Agent, or Firm* — Georgiy L. Khayet (57) ABSTRACT

A circuit board enclosure comprises a circuit breaker, platform, base, cover, and circuit board. The circuit breaker includes two conductors and a plate, which is connected to the conductors. The platform receives the circuit breaker. The base has a bottom member and an opening arranged in the bottom member. The base receives the platform with the circuit breaker such that the plate of the circuit breaker is accommodated substantially within the opening of the bottom member. The cover is configured to cover the base and form an interior space. The interior space accommodates the platform, the circuit breaker, and the circuit board. The circuit board is connected to the circuit breaker. The circuit board enclosure can be adhered to a substantially planar surface. The plate is configured such that removal of the circuit board enclosure from the substantially planar surface will damage the connection of the plate to the conductors.

20 Claims, 11 Drawing Sheets

CIRCUIT BOARD ENCLOSURE WITH SECURITY FEATURES PREVENTING DISASSEMBLY OR DISENGAGEMENT

TECHNICAL FIELD

This disclosure relates generally to an enclosure for a circuit board and, more specifically, to a circuit board enclosure including security features which terminate the operation of circuit board upon opening, disassembling, disengagement, or destruction of the circuit board or the circuit board enclosure by an intruder.

DESCRIPTION OF RELATED ART

The approaches described in this section could be pursued, but are not necessarily approaches that have been previously conceived or pursued. Therefore, unless otherwise indicated herein, the approaches described in this section are not prior art to the claims in this application and are not admitted to be prior art by inclusion in this section.

It is an important task to protect printed circuit boards to prevent their physical damage, keep out dust and moisture, and eliminate short circuit hazards. For these ends, an enclosure is provided to enclose a printed circuit board within its interior. A large variety of enclosures or boxes is known to support and contain the printed circuit boards. However, there are no enclosures configured to protect the printed circuit boards effectively from unauthorized intrusions, uses, disengagement, or removal.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

The embodiments of this disclosure relate to a circuit board enclosure for enclosing a circuit board and protecting the circuit board from various hazards and unauthorized opening, disassembling, disengagement, or destruction of the circuit board or circuit board enclosure by an intruder. In some embodiments, the circuit board refers to an identification tag passively or actively emitting a vehicle identification signal. Moreover, the circuit board enclosure can be attached to a substantially planar surface, such as a windshield or dashboard of a vehicle, using, for example, a double-sided tape. The embodiments of this disclosure illustrate that upon removal the circuit board enclosure from the substantially planar surface or upon opening, disassembling or destructing the circuit board enclosure, the circuit board stops operating or performs any other security measures preventing the intruder to use it in any unauthorized manner.

In one aspect of the present disclosure, there is provided a circuit board enclosure, which comprises a circuit breaker, a platform, a base, and a cover. The circuit breaker includes two conductors and a plate. The plate is electrically connected to the conductors. The platform is configured to receive the circuit breaker. The base has a bottom member and an opening arranged in the bottom member. The base is also configured to receive the platform such that the plate of the circuit breaker is accommodated substantially within the opening of the bottom member. The cover is configured to cover the base and form an interior space when the cover is attached to the base. The interior space accommodates the platform and the circuit breaker.

In some embodiments, the circuit board enclosure further includes a circuit board configured to be connected to the circuit breaker and arranged within the interior space. The cover can be configured to receive and hold the circuit board. In some embodiments, the cover includes a top member and slide bars. The slide bars are arranged below the top member so as to be inside the interior space when the cover is attached to the base. The slide bars are configured to receive and hold the circuit board. The cover can be configured to disengage the circuit breaker from the circuit board when the cover is opened. The circuit board can include a detector configured to detect that the cover is opened, disassembled, or disengaged from the base by determining that the circuit breaker changes to an open circuit. The circuit board can be also configured to stop operating when the detector detects that the cover is opened, disassembled, or disengaged from the base.

In some embodiments, when the circuit breaker is assembled with the base and the platform, a bottom surface of the plate of the circuit breaker is substantially of the same level as a bottom surface of the base. In some embodiments, the circuit board enclosure further comprises a first binding agent provided on a bottom surface of the base for attaching the circuit board enclosure to a substantially planar surface. The circuit board enclosure can further comprise a second binding agent provided on a bottom surface of the plate for attaching to a substantially planar surface. The plate can be configured such that removal of the circuit board enclosure from the substantially planar surface will damage the connection of the plate to the conductors. The plate can be electrically connected to the conductors through electrically conducting arms. The arms can be substantially perpendicular to the conductors. The plate can be made of a metal.

In some embodiments, the platform includes a substrate and a support member. The support member can be provided on a bottom side of the substrate, and the plate can contact the support member when the platform receives the circuit breaker. The platform may include grooves on the bottom side of the substrate for receiving the conductors of the circuit breaker. Moreover, in some embodiments, the bottom member of the base includes a recess for receiving the platform and the circuit breaker.

In yet more embodiments, the base further includes three or more base walls, which are attached to the bottom member in a substantially perpendicular manner. In some embodiments, the base further includes a flange portion provided on a bottom surface of the bottom member and around the opening of the bottom member. At least two of the base walls can include stoppers and at least one of the base walls includes a connecting opening. The cover can include a top member and at least one cover wall attached to the top member in a substantially perpendicular manner. The cover further can include at least one connecting protrusion for engaging with the connecting opening of the base walls. At least one cover wall can include guiding protrusions for engaging with the stoppers of the base.

Other features and exemplary embodiments will be evident from the detailed description provided below.

BRIEF DESCRIPTION OF DRAWINGS

Embodiments are illustrated by way of example and not limitation in the figures of the accompanying drawings, in which like references indicate similar elements and in which.

DETAILED DESCRIPTION OF EMBODIMENTS

The following detailed description of embodiments includes references to the accompanying drawings, which form a part of the detailed description. Approaches described in this section are not prior art to the claims and are not admitted to be prior art by inclusion in this section. The drawings show illustrations in accordance with example embodiments. These example embodiments, which are also referred to herein as "examples," are described in enough detail to enable those skilled in the art to practice the present subject matter. The embodiments can be combined, other embodiments can be utilized, or structural, logical and operational changes can be made without departing from the scope of what is claimed. The following detailed description is, therefore, not to be taken in a limiting sense, and the scope is defined by the appended claims and their equivalents.

The embodiments of this disclosure relate to a circuit board enclosure for enclosing a circuit board and protecting the circuit board from various hazards and from unauthorized opening, disassembling, disengagement, or destruction of the circuit board or circuit board enclosure by an intruder. For example, the circuit board enclosure can enclose an identification tag that can emit an electromagnetic signal such as a vehicle identification signal for identifying a vehicle. The circuit board enclosure can be attached to a substantially planar surface such as a windshield of a vehicle so as to be readily used for vehicle identification. The embodiments of this disclosure illustrate that upon removal the circuit board enclosure from a substantially planar surface or upon opening, disassembling or destructing the circuit board enclosure, the circuit board stops operating or performs any other security measures preventing the intruder. This features help to protect the circuit board and the circuit board enclosure from unauthorized uses.

For purposes of this patent document, the terms "or" and "and" shall mean "and/or" unless stated otherwise or clearly intended otherwise by the context of their use. The term "a" shall mean "one or more" unless stated otherwise or where the use of "one or more" is clearly inappropriate. The terms "comprise," "comprising," "include," and "including" are interchangeable and not intended to be limiting. For example, the term "including" shall be interpreted to mean "including, but not limited to." Additionally, all ranges provided herein include the upper and lower values of the range unless explicitly noted. For example, the term "about" shall mean a reasonable deviation from a value accompanying this term.

It should be also understood that the terms "first," "second," "third," and so forth can be used herein to describe various elements. These terms are used to distinguish one element from another, but not to imply a required sequence of elements. For example, a first element can be termed a second element, and, similarly, a second element can be termed a first element, without departing from the scope of present teachings.

Moreover, it shall be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," and so forth). Spatially relative terms, such as "beneath," "below," "lower," "above," "upper" and the like may be used to describe an element or feature's relationship to another element(s) and/or feature(s) as, for example, illustrated in the drawings. It shall be appreciated the spatially relative terms are intended to encompass different orientations of the circuit board enclosure or its elements in use in addition to the orientation depicted in the figures. For example, if the circuit board enclosure or any of its components in the drawings is turned over, elements described as "below" and/or "beneath" other elements or features would then be oriented "above" the other elements or features. The circuit board enclosure or its components may be otherwise oriented (e.g., rotated 90 degrees or at other orientations) and the spatially relative descriptors used herein interpreted accordingly.

Furthermore, for purposes of this patent document, the term "enclosure" shall mean any movable or immovable container, housing, or box having an interior space. The enclosure can accommodate various elements, modules or devices. The enclosure can be assembled from multiple parts. The term "circuit board" generally refers to a printed circuit board, wafer, or substrate with one or more surfaces having thereon one or more electrically-conductive pathways and one or more electrical components including, but not limited to, resistors, capacitors, inductors, transistors, integrated circuits, chips, controllers, microprocessors, antennas, connection ports, switches, power sources, batteries, light-emitting diodes, sensors, detectors, transmitters, receivers, electrical motors, and so forth. The terms "circuit board" can be used interchangeably with the term "printed circuit board" (PCB).

Now, exemplary embodiments are described with reference to the drawings. The drawings are schematic illustrations of idealized example embodiments. As such, variations from the shapes of the illustrations as a result, for example, of manufacturing techniques or tolerances, are to be expected. Thus, example embodiments discussed herein should not be construed as limited to the particular shapes of regions illustrated herein but are to include deviations in shapes that result, for example, from manufacturing.

Figure 1:
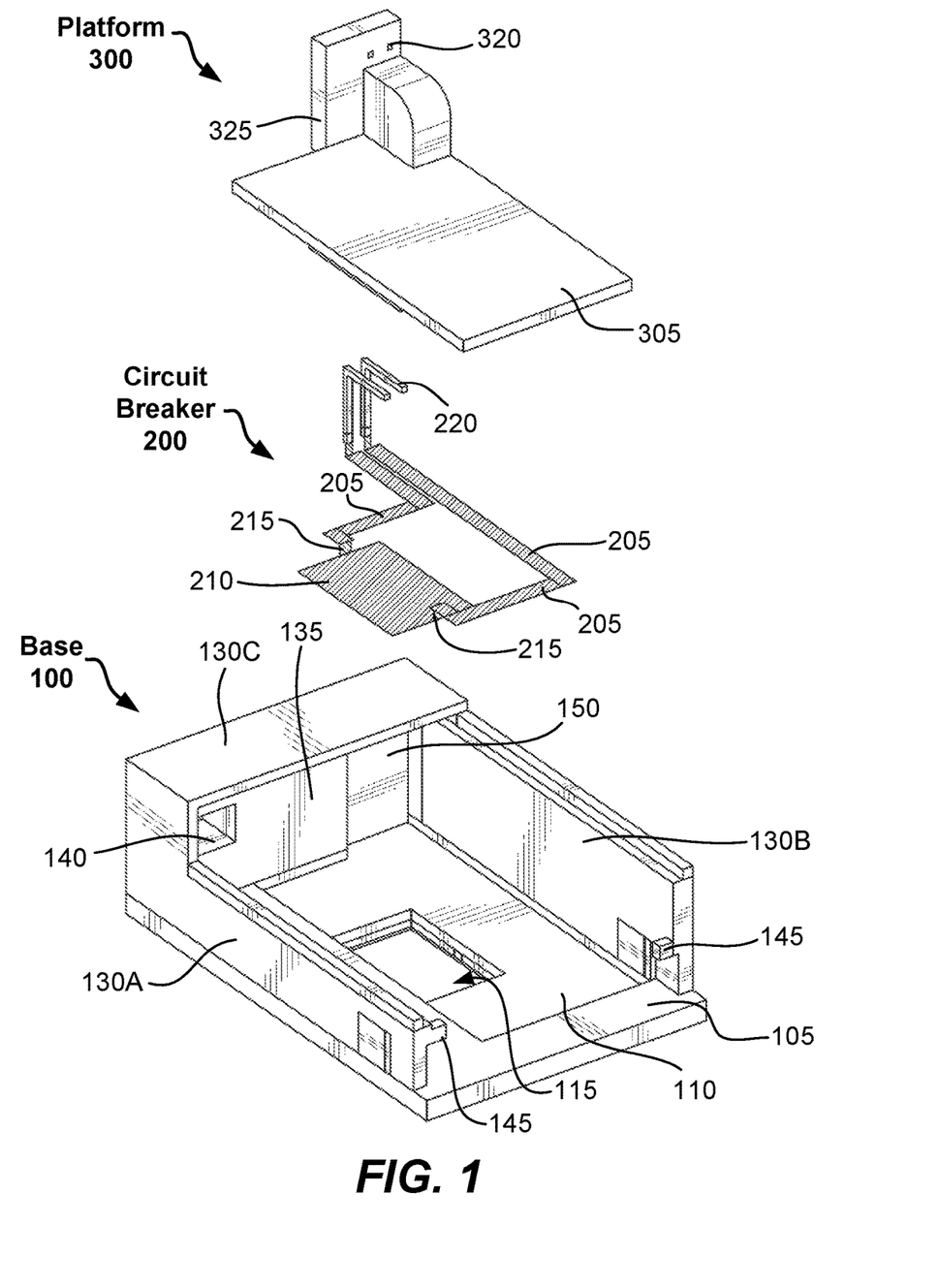
FIG. 1 shows an exploded top view of a base, circuit breaker, and platform of a circuit board enclosure.
Figure 2:
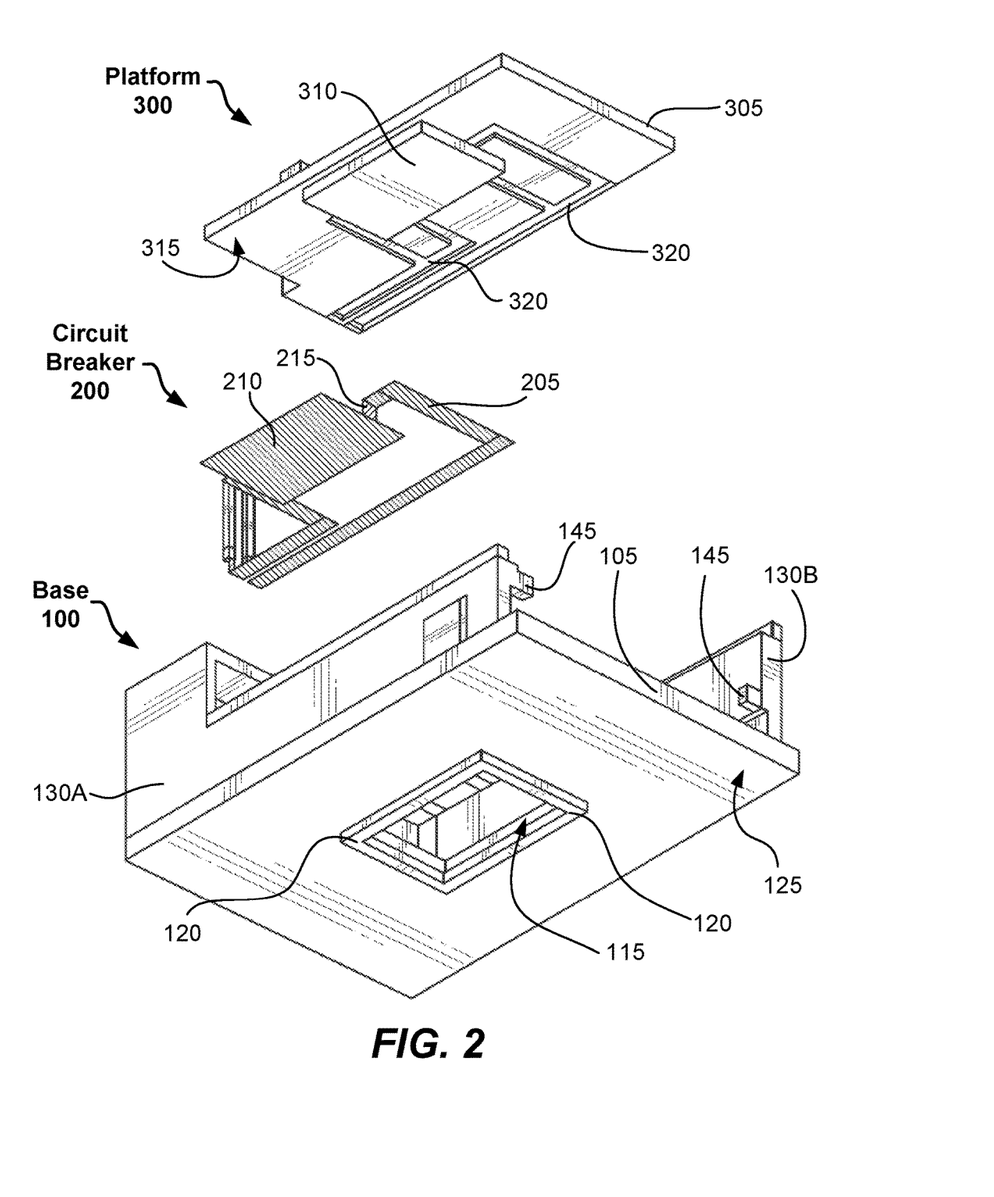
FIG. 2 shows an exploded bottom view of the base, circuit breaker, and platform of the circuit board enclosure.
Figure 3:
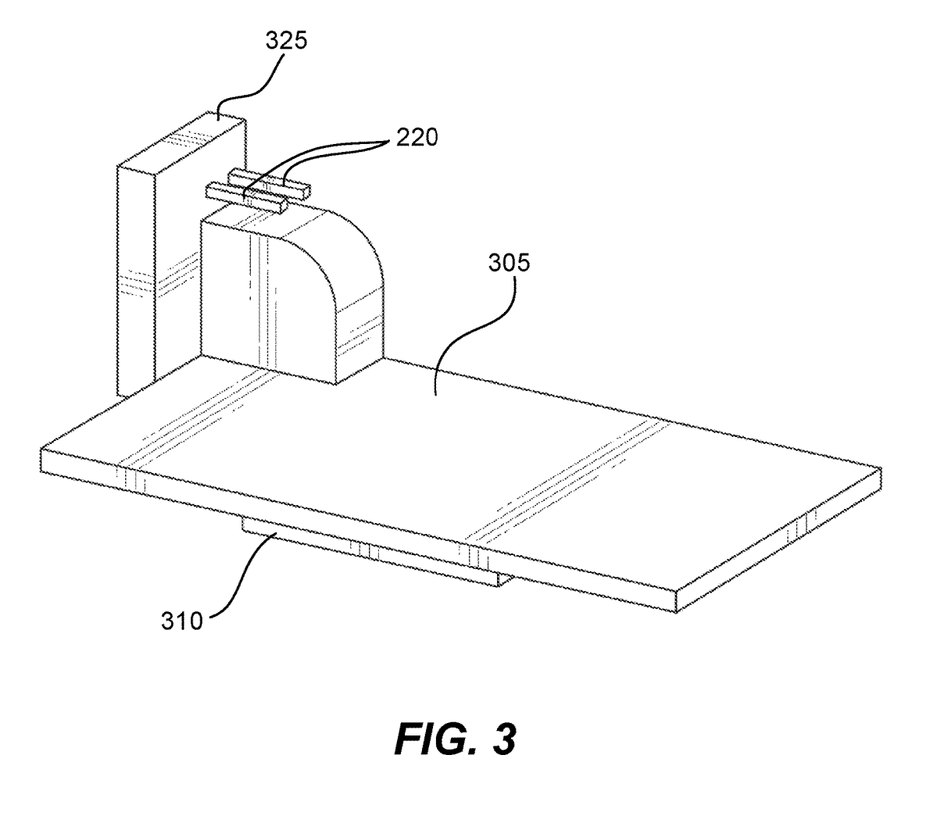
FIG. 3 shows an assembled top view of the platform and circuit breaker of the circuit board enclosure.
Figure 4:
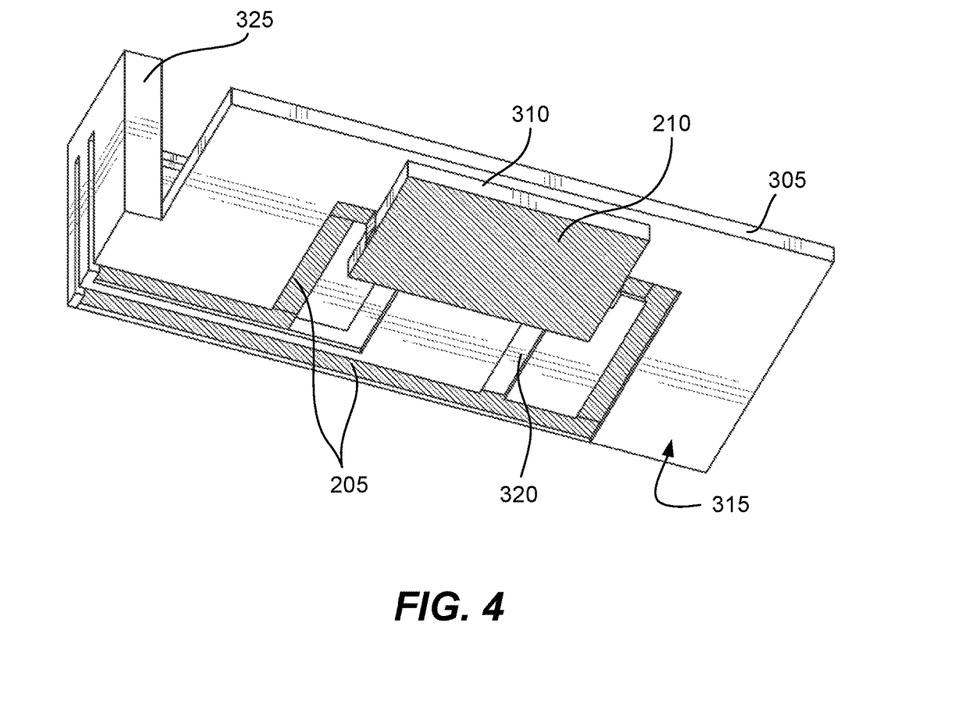
FIG. 4 shows an assembled bottom view of the platform and circuit breaker of the circuit board enclosure.
Figure 5:
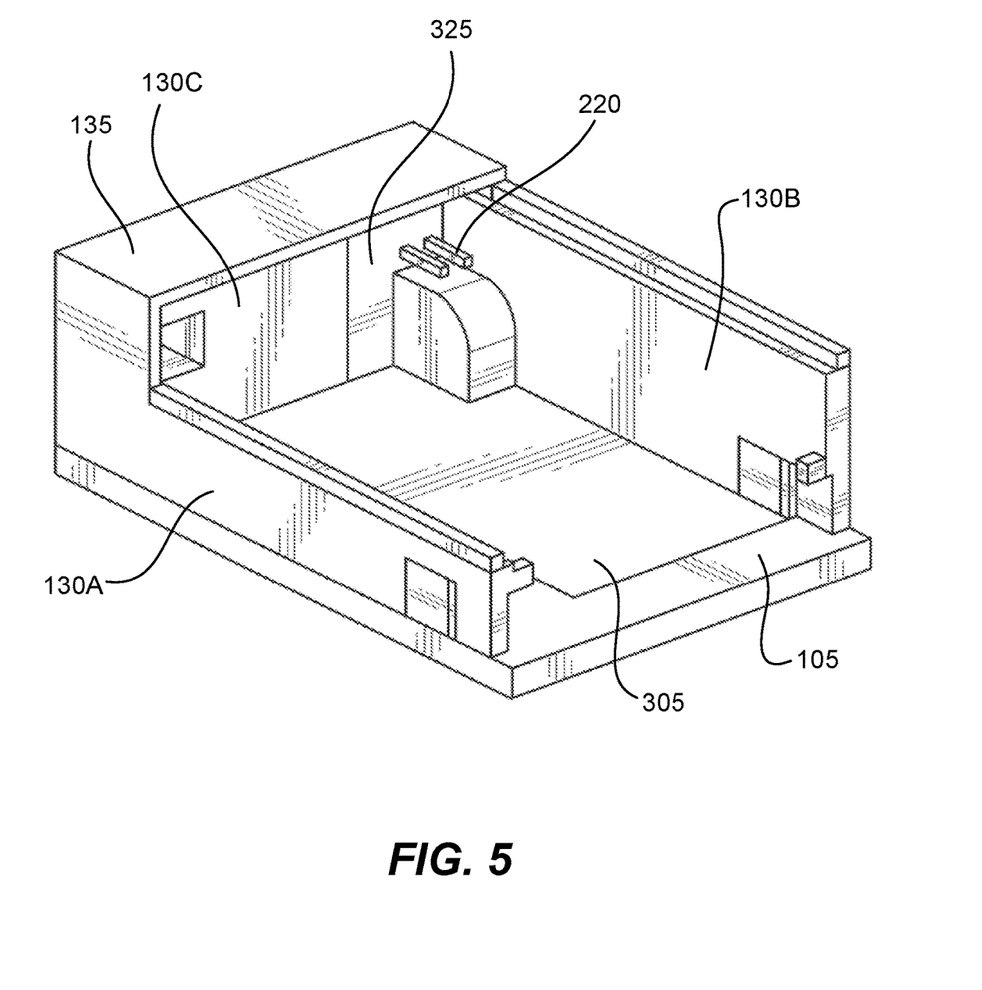
FIG. 5 shows an assembled top view of the platform, circuit breaker, and base of the circuit board enclosure.
Figure 6:
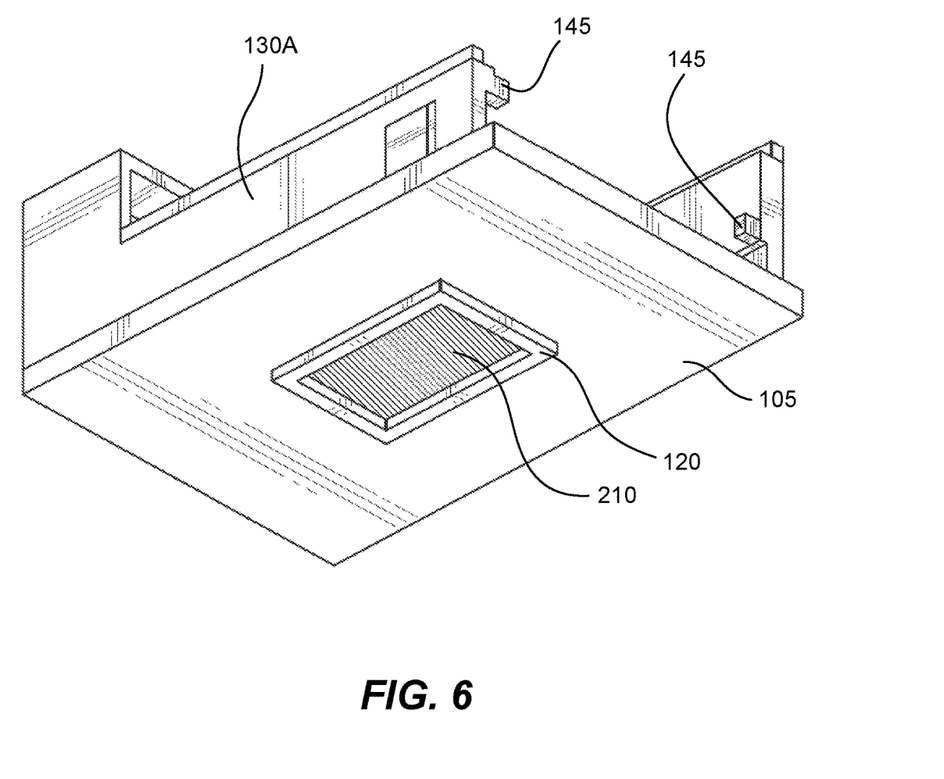
FIG. 6 shows an assembled bottom view of the platform, circuit breaker, and base of the circuit board enclosure.

FIG. 1 shows an exploded top view of a base 100, a circuit breaker 200, and a platform 300. FIG. 2 shows the same elements, but in an exploded bottom view. These elements provide a lower portion of a circuit board enclosure 1000. FIG. 5 shows an assembled top view of the base 100, the circuit breaker 200, and the platform 300. FIG. 6 shows the same elements, but in an assembled bottom view.

Figure 7:
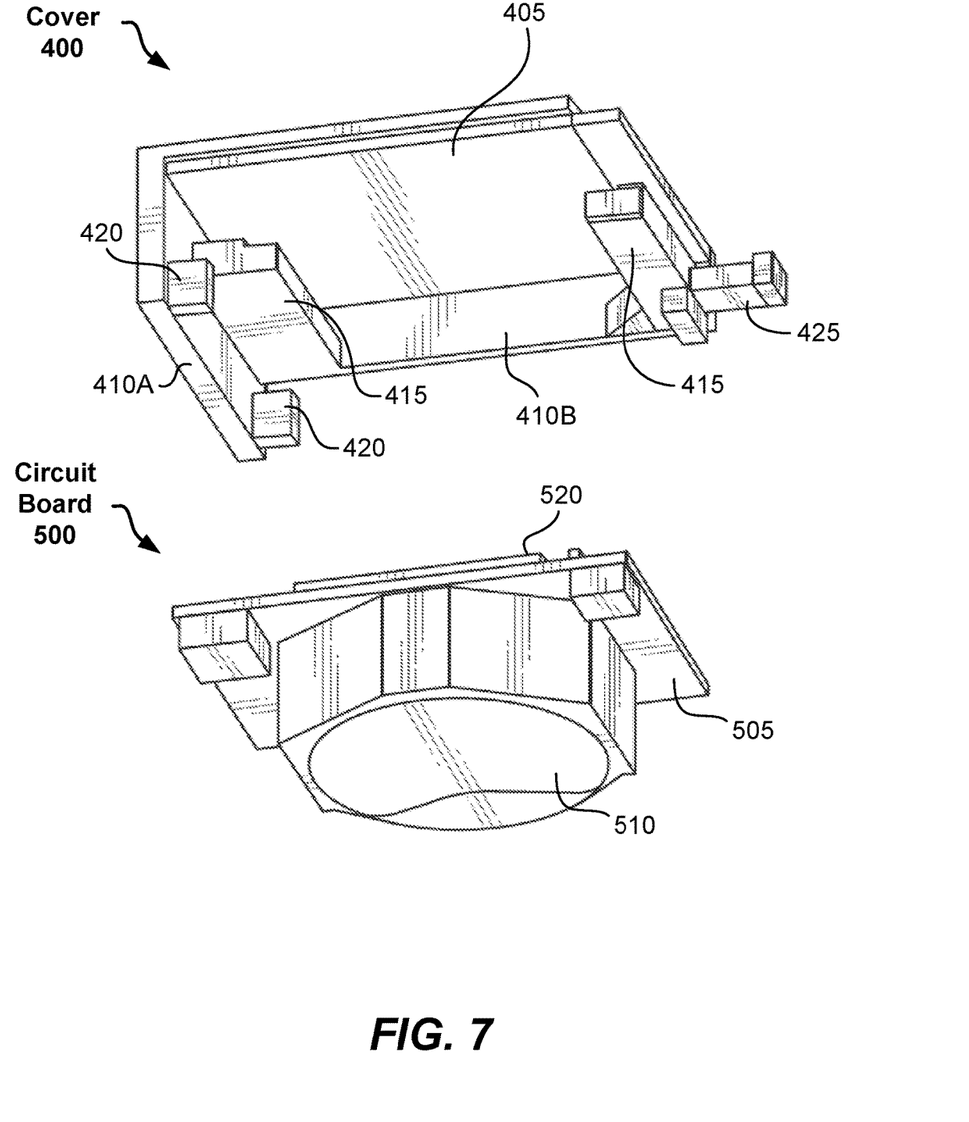
FIG. 7 shows an exploded bottom view of a cover and a circuit board of the circuit board enclosure.
Figure 8:
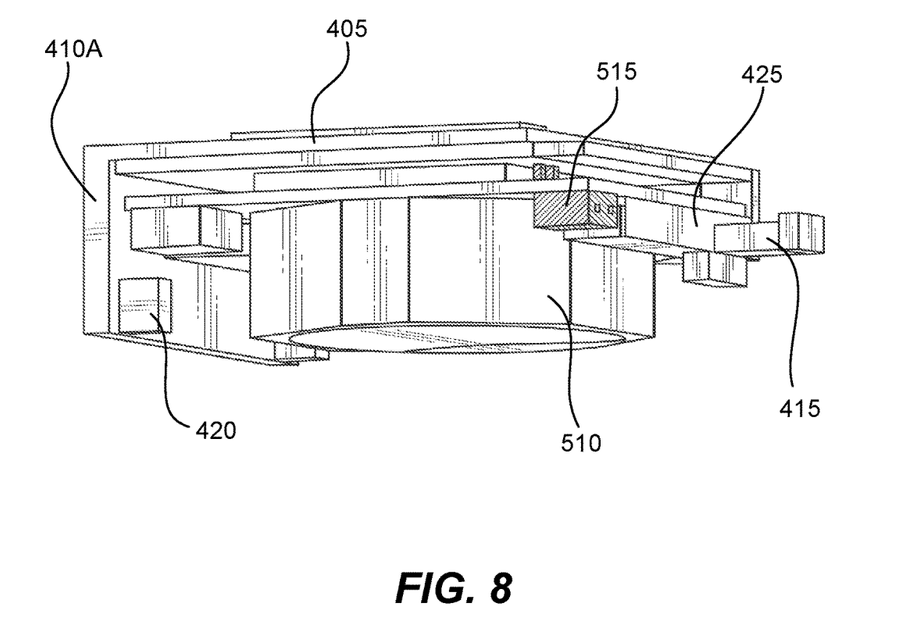
FIG. 8 shows an assembled view of the cover and the circuit board of the circuit board enclosure.

FIG. 7 shows an exploded bottom view of a cover 400 and a circuit board 500. FIG. 8 shows the same cover 400 and circuit board 500, but in an assembled view. The cover 400 and circuit board 500 provide an upper portion of a circuit board enclosure 1000.

Figure 9:
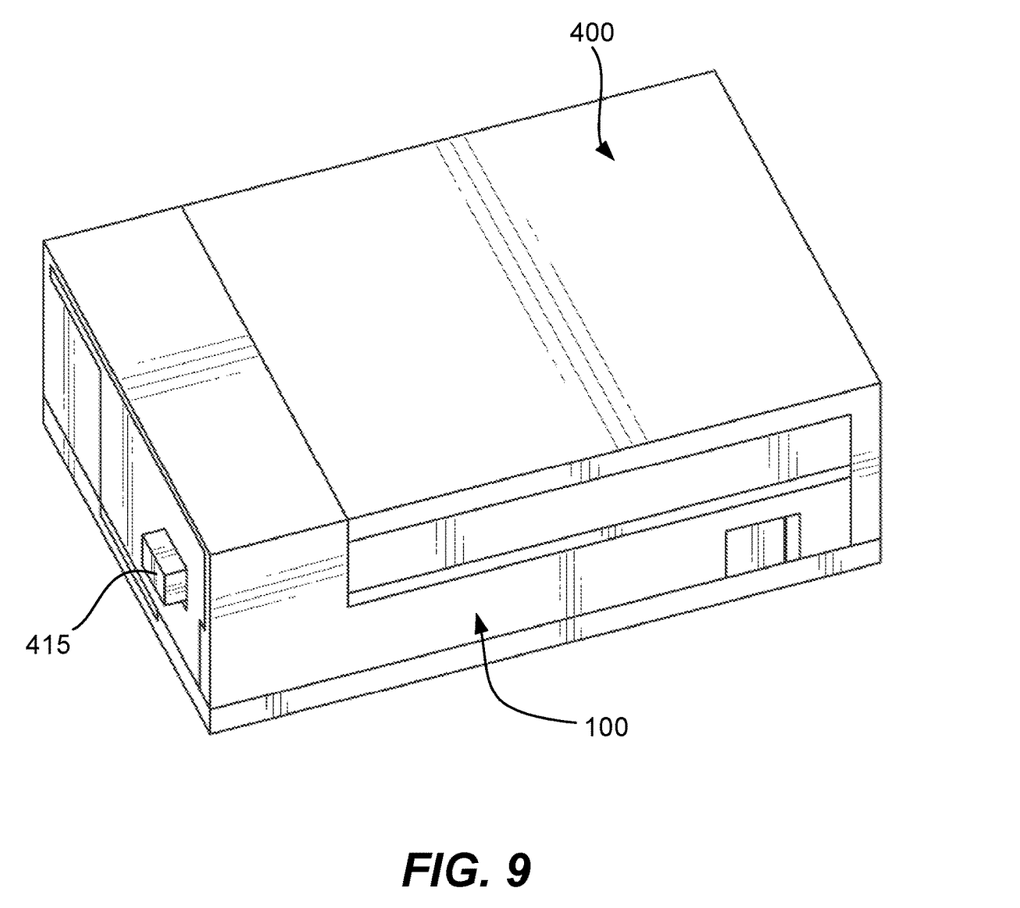
FIG. 9 shows an assembled top view of the circuit board enclosure.
Figure 10:
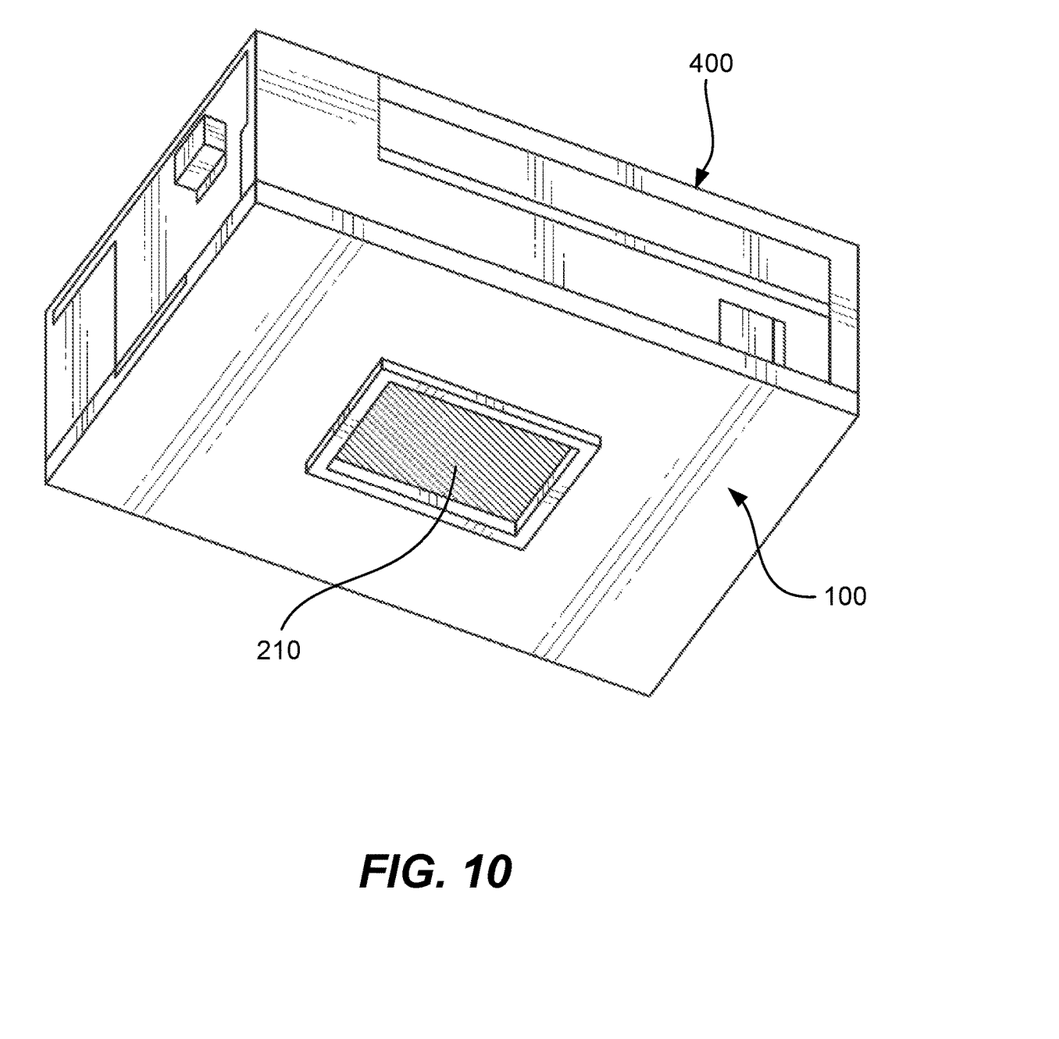
FIG. 10 shows an assembled bottom view of the circuit board enclosure.

When the lower portion is coupled to the upper portion, the circuit board enclosure 1000 becomes assembled. FIG. 9 shows an assembled top view of the circuit board enclosure 1000 and FIG. 10 shows an assembled bottom view of the same circuit board enclosure 1000.

Referring now to FIG. 1 and FIG. 2, the base 100 includes a bottom member 105, which can include, for example, a substantially planar plate of a rectangular shape. The bottom member 105 includes a recess 110 for receiving the circuit breaker 200 and the platform 300. The bottom member 105 also has an opening 115 arranged substantially in the middle of the bottom member 105. The opening 115 can be via opening of any reasonable shape. For example, the opening 115 can be of a rectangular, circular, or any other designs. The bottom member 105 can optionally include a flange portion 120 arranged on a bottom surface 125 of the bottom member 105 and substantially near and around the opening 115. In certain embodiments, the flange portion 120 can have a thickness matching the thickness of a binding agent as described below. One example of applicable binding agents relates to a double-sided tape. For example, the thickness of the flange portion 120 can be in a range of 0.1 millimeter to about 5 millimeters. Thus, the thickness of the flange portion 120 can be about the same as the thickness of double-sided tape which can protect an assembled circuit board enclosure 1000 from someone trying to slide a sharp object in order to separate the circuit board enclosure 1000 from a substantially planar surface to which the circuit board enclosure 1000 can be connected by using one or more binding agents.

The base 100 also includes one or more walls such as base walls 130A, 130B, and 130C, which are directly connected to the bottom member 105 in a substantially perpendicular manner. The base 100 can optionally include a top wall 135, which is directly connected to the base walls 130A, 130B, and 130C. The base wall 130C can include a recess 150 for receiving a portion of the circuit breaker 200 or a portion of the platform 300. The base wall 130C can also include a connecting opening 140 arranged near a corner of the base walls 130A, 130C and the top wall 135. There can be provided more than one connecting opening in the base 100. The base can also include one or more connecting protrusions. For example, the base wall 130A can include a stopper 145 arranged in substantially perpendicular manner to the base wall 130A. The stopper 145 can be provided in a part of the base wall 130A being opposite to the side where the connecting opening 140 is provided. Similarly, the base wall 130B can include a second stopper 145 arranged in substantially perpendicular manner to the base wall 130B. The stopper 145 can be provided in a part of the base wall 130B being opposite to the side where the connecting opening 140 is provided.

The elements of base 100 can be made of polymeric materials, including, but not limited to, polyamides, polyimides, nylon polymer, polyurethane, polyester, polypropylene, polyethylene, polystyrene, polycarbonate, diene-containing polymers, such as AES (polyacrylontrile ethylene styrene), acrylic polymers, or any combination thereof. In other embodiments, the elements of base 100 can be made of wood, metal, glass, ceramic, resin, and the like.

In some embodiments, the circuit breaker 200 includes at least two conductors 205 and a plate 210. The conductors 205 can be made of electrically conducting material such as a metal (e.g., copper or its alloys). Similarly, the plate 210 can be made of electrically conducting material such as a metal (e.g., copper or its alloys). The plate 210 can be operatively connected to the conductors 205 enabling to an electrical current to flow through the plate 210. In some embodiments, the conductors 205 can be thin conducting bands.

Generally, the circuit breaker 200 is to be connected to the circuit board 500, which can cause electrical current to flow through the conductors 205 and plate 210. When the circuit breaker 200 is damaged by an intruder, the flow of electrical current is interrupted, which can cause the circuit board 500 to detect this event and implement security measures such as stop working.

In some embodiments, the plate 210 can be operatively connected to the conductors 205 through arms 215. The arms 215 can be made of electrically conducting material such as a metal (e.g., copper). The arms 215 can be thin conducting bands. The arms 215 constitute a "weak link" meaning that when the plate 210 is glued to a surface and an intruder removes the circuit board enclosure 1000 from that surface, the arms 215 physically break causing electrical break in the circuit breaker 200.

The arms 215 can be substantially perpendicular to the both the plate 210 and the conductors 205. The length of arms 215 can be about the same length as the thickness of the bottom member 105. In this case, when the recess 110 of the bottom member 105 receives a portion of the circuit breaker 200, the plate 210 becomes of the same level as a level of the bottom surface 125 of the base 100. FIG. 6 shows an assembled bottom view of the circuit breaker 200 and base 100.

In other embodiments, the length of arms 215 can be about the same length as the thickness of the bottom member 105 including the flange portion 120. In this case, when the recess 110 of the bottom member 105 receives a portion of the circuit breaker 200, the plate 210 becomes of the same level as a level of a bottom surface of the flange portion 120.

Still referring to FIG. 1 and FIG. 2, the circuit breaker 200 includes connectors 220 directly coupled to the conductors 205. The connectors 220 can be of electrically conducting material (e.g., metal) and have an L-shape design. The connectors 220 can have a rectangular cross section. The connectors 220 are designed to be connected to a port of the circuit board 500.

Referring now to FIGS. 1-4, the platform 300 is provided to support the circuit breaker 200. The platform 300 includes a substrate 305 and a support member 310. The substrate 305 can be of substantially planar and rectangular design configured to fit the recess 110 of the bottom member 105. The support member 310 is provided on a bottom surface 315 of the substrate 305. The support member 310 can have a rectangular shape with width and length being substantially the same as the width and length of the plate 210. Thus, the plate 210 can be directly arranged on the lower surface of the support member 310. In some embodiments, the plate 210 can be permanently connected (e.g., glued) to the lower surface of the support member 310.

In some embodiments, the platform 300 can include one or more grooves 320 for receiving conductors 205. The grooves 320 can be provided on the bottom surface 315 of the substrate 305. The thickness of the grooves 320 can be about the same as the thickness of conductors 205.

In some embodiments, the platform 300 also includes a platform wall 325 of complex design being substantially perpendicular to the substrate 305. The recess 150 in the base wall 130C can be configured to receive a portion of the platform wall 325 as shown in the figures. The platform wall 325 can also have grooves and openings 330 for receiving the connectors 220.

The elements of platform 300 can be made of polymeric materials, including, but not limited to, polyamides, polyimides, nylon polymer, polyurethane, polyester, polypropylene, polyethylene, polystyrene, polycarbonate, diene-containing polymers, such as AES, acrylic polymers, or any combination thereof. In other embodiments, the elements of platform 300 can be made of wood, metal, glass, ceramic, resin, and the like.

The base 100, circuit breaker 200, and platform 300 constitute the lower portion of the circuit board enclosure 1000. FIG. 5 shows the assembled top view of the lower portion of the circuit board enclosure 1000 and FIG. 6 shows the assembled bottom view of the lower portion of the circuit board enclosure 1000 according to one example embodiment.

Referring now to FIG. 7 and FIG. 8, these drawings illustrate the cover 400 and circuit board 500. According to one embodiment, the cover 400 includes a top member 405. The top member 405 can include, for example, a substantially planar plate of rectangular shape. Moreover, in certain embodiments, the cover 400 can include one or more walls directly connected to the top member 405. For example, the cover 400 has a cover wall 410A and a cover wall 410B. The cover walls 410A, 410B can be substantially perpendicular to each other and the top member 405.

In some embodiments, there can be provided two or more slide bars 415 directly or indirectly connected to the top member 405. For example, as shown in FIG. 7, the slide bars 415 are directly connected to the cover wall 410B in a substantially perpendicular manner. As illustrated, the slide bars 415 are arranged substantially parallel to the top member 405. Moreover, the slide bars 415 will be substantially parallel to the bottom member 405 after assembling the cover 400 with the base 100. The slide bars 415 receive the circuit board 500 in a sliding manner. In some embodiments, the slide bars 415 can hold the circuit board 500. For these ends, there can be provided clips, grips, or connectors. In yet further embodiments, the slide bars 415 can provide another level of protection. For example, in certain embodiments, the slide bars 415 are made so that when someone is attempting to open the cover 400, the slide bars 415 will drag the circuit board 500, thereby causing a separation between the port 515 and the connectors 220 (which ultimately triggers the detector and results in the implementation of security measures).

In some embodiments, there can be provided one or more connecting elements for connecting the cover 400 to the base 100. For example, the cover wall 410A can include two or more guiding protrusions 420 arranged substantially perpendicular to the cover wall 410A and facing inward the interior space of the circuit board enclosure 1000. Upon assembling, the guiding protrusions 420 contact the stoppers 145 of the base in a sliding manner. Thus, the stoppers 145 and guiding protrusions 420 guide the assembly of the cover 400 with the base 100.

In some embodiments, one of the walls of the cover 400 or a slide bars 415 can include a connecting protrusion. For example, as shown in FIG. 7, one or the slide bars 415 includes a connecting protrusion 425 arranged substantially perpendicular to the slide bar 415 but substantially parallel to the top member 405. The connecting protrusion 425 faces outwards the interior space of the circuit board enclosure 1000. Upon assembling, the connecting protrusion 425 of the cover 400 engages with the connecting opening 140 of the base 100. In certain embodiments, the connecting protrusion 425 can include elastic elements, such as clips, for more secure engagement with the connecting opening 140 of the base 100.

The elements of cover 400 can be made of polymeric materials, including, but not limited to, polyamides, polyimides, nylon polymer, polyurethane, polyester, polypropylene, polyethylene, polystyrene, polycarbonate, diene-containing polymers, such as AES, acrylic polymers, or any combination thereof. In other embodiments, the elements of cover 400 can be made of wood, metal, glass, ceramic, resin, and the like.

The circuit board 500 can refer to any suitable electronic circuit for solving any suitable tasks. In one example embodiment, however, the circuit board 500 relates to a wireless passive or active identification tag, such as, but not limited to, a radio-frequency identification (RFID) tag, Wi-Fi™ tag, Bluetooth™ tag, and so forth. The identification tag can be used on all or certain motor vehicles within a dedicated area and configured to emit identification signals, which include a vehicle identifier and, optionally, other information related to the vehicle or its owner. The identification signal can be propagated across a relatively short distance, for example, less than 300 feet or even less than 100 feet when the vehicle is in an unassisted view of a human eye.

Certain example embodiments of the identification tag are described in a co-pending U.S. utility patent application Ser. No. 14/172,025 filed Feb. 4, 2014, entitled "Remote Identification of Vehicle Status" and in a co-pending U.S. utility patent application Ser. No. 14/258,584 filed Apr. 22, 2014, entitled "Parking and Tollgate Payment Processing Based on Vehicle Remote Identification," which are incorporated herein by reference in their entirety for all purposes.

Still referring now to FIG. 7 and FIG. 8, the circuit board 500 can include a substrate 505 and one or more electronic components 510, 520 such as resistors, capacitors, inductors, transistors, integrated circuits, chips, controllers, microprocessors, antennas, connection ports, switches, power sources, batteries, light-emitting diodes, sensors, detectors, transmitters, receivers, electrical motors, and so forth.

The substrate 505 can slide and engage with the slide bars 415 so as to hold the circuit board 500 within the interior space of the circuit board enclosure 1000. In some embodiments, the circuit board 500 can include a port 515 for operatively connecting with the connectors 220 of the circuit breaker 200. Moreover, in some embodiments, the port 515 can include or be connected to a detector configured to detect when the cover 400 is opened, disassembled, disengaged, or removed from the base 100. The detector can include a push button, breakable pins, magnetic connector, and the like. The circuit board 500 can be also configured to implement any reasonable protective measures when the detector detects that the cover 400 is opened, disassembled, or disengaged from the base 100. The protective measures can include the termination of operation of the circuit board 500, destroying at least a part of the circuit board 500, deleting data from one or more chips or memories of the circuit board 500, and the like.

The circuit board enclosure 1000 can be assembled as follows. First, the circuit breaker 200 is directly coupled with the platform 300. Second, the circuit board 500 is fixed to the cover 400 (to be in the direct contact with the slide bars 415). Third, the platform 300 with the circuit breaker 200 connected to the platform 300 are inserted into the recesses 110 and 150 of the base 100 such that the plate 210 of the circuit breaker 200 is accommodated within the opening 115 of the base 100. Fourth, the cover 400 with the circuit board 500 are connected to the base 100. When the cover 400 is connected to the base 100, they form an interior space of the circuit board enclosure 1000 such that the interior space of the circuit board enclosure 1000 accommodates the circuit board 500, platform 300 and circuit breaker 200. FIG. 9 shows an assembled top view of the circuit board enclosure 1000 and FIG. 10 shows an assembled bottom view of the circuit board enclosure 1000.

Figure 11:
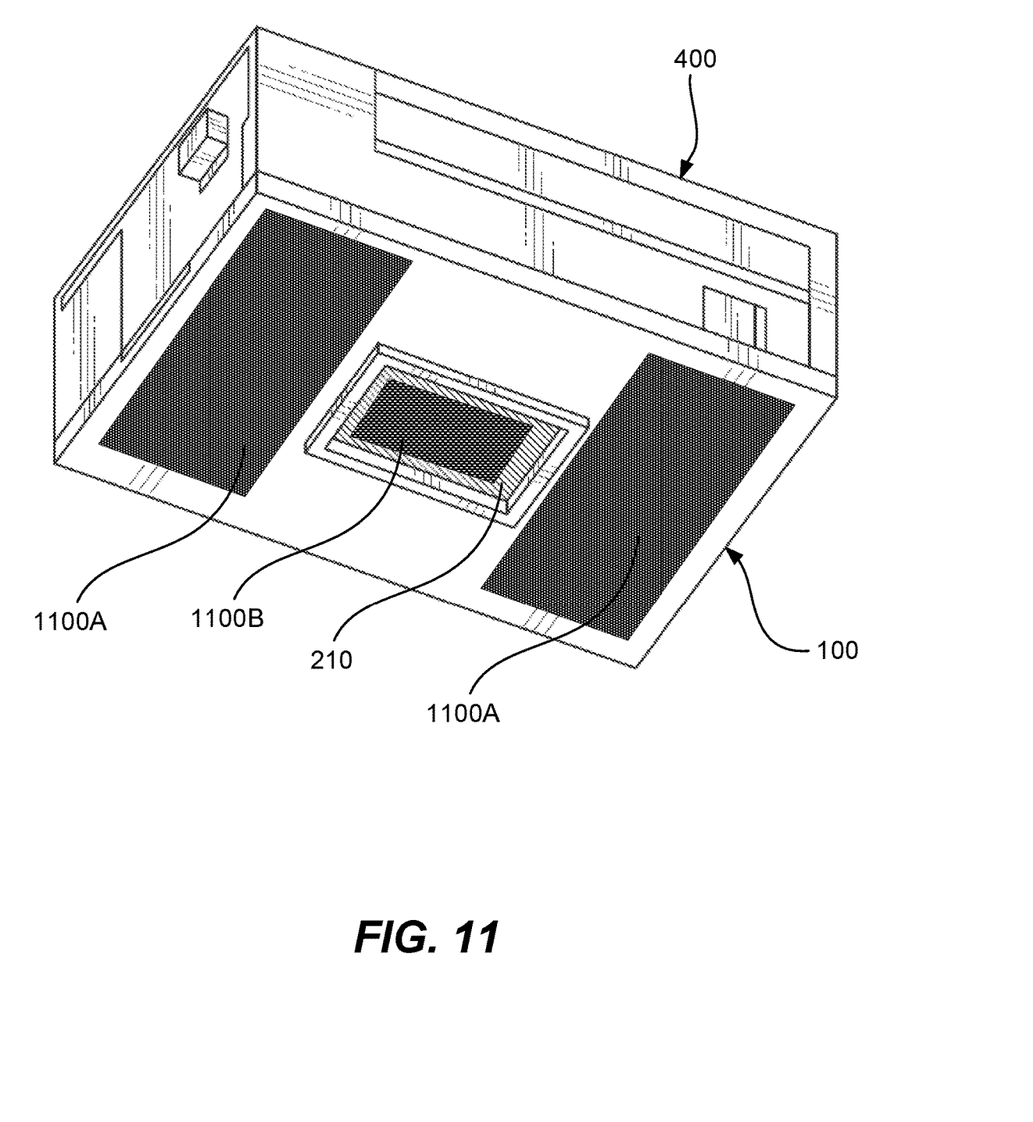
FIG. 11 shows an assembled bottom view of the circuit board enclosure with binding agents.

According to some embodiments, the circuit board enclosure 1000 can be secured to a substantially planar surface such as a windshield or dashboard of a vehicle. The connection of the circuit board enclosure 1000 to the substantially planar surface can be implemented with the help of one or more binding agents such as adhesives, binders or glues. For example, as shown in FIG. 11, the bottom surface 125 of the bottom member 105 can be provided with a first binding agent 1100A for direct permanent or removable connection with the substantially planar surface. Further, a bottom side of the plate 210 of the circuit breaker 200 can be provided with a second binding agent 1100B for direct permanent or removable connection with the substantially planar surface.

In one example embodiment, the first binding agent 1100A can be the same as the second binding agent 1100B. For example, the first binding agent 1100A and second binding agent 1100B are a double-sided tape. In another example embodiment, the first binding agent 1100A differs from the second binding agent 1100B. For example, the first binding agent 1100A is a double-sided tape and the second binding agent 1100B includes glue.

After the circuit board enclosure 1000 is secured to the substantially planar surface using at least one of the first binding agent 1100A and the second binding agent 1100B, the removal of the circuit board enclosure 1000 from the substantially planar surface will damage either the plate 210 or arms 215 in such a way that the electrical circuit of the circuit breaker 200 breaks (for example, upon removal, the arms 215 can break and the plate 210 will be disconnected from the conductors 205). The break of the circuit breaker 200 prevents electrical current to flow through the circuit breaker 200 and the plate 210 in particular. A sensing circuit or switch of circuit board 500 can detect the event of removal of the circuit board enclosure 1000 from the substantially planar surface by detecting that the current stopped flowing through the circuit breaker 200 and the plate 210. In this case, the circuit board 500 can implement one or more protective measures such as stop working or deleting data from memory.

Thus, the embodiments of circuit board enclosure have been described. Although embodiments have been described with reference to specific example embodiments, it will be evident that various modifications and changes can be made to these example embodiments without departing from the broader spirit and scope of the present application. Accordingly, the specification and drawings are to be regarded in an illustrative rather than a restrictive sense.

What is claimed is:

1. A circuit board enclosure comprising:
    a circuit breaker including two conductors and a plate, the plate being electrically connected to the conductors, the conductors being configured to conduct an electrical current to the plate;
    a platform for receiving the circuit breaker;
    a base having a bottom member and an opening arranged in the bottom member of the base, wherein the base is configured to receive the platform and the circuit breaker such that the plate of the circuit breaker is accommodated substantially within the opening of the bottom member; and
    a cover for covering the base, wherein the base and the cover form an interior space when the cover is attached to the base, the interior space accommodates the platform and the circuit breaker.

2. The circuit board enclosure of claim 1, further comprising a circuit board configured to be connected to the circuit breaker and arranged within the interior space.

3. The circuit board enclosure of claim 2, wherein the cover is configured to receive and hold the circuit board.

4. The circuit board enclosure of claim 3, wherein the cover includes a top member and slide bars, wherein the slide bars are arranged below the top member so as to be inside the interior space when the cover is attached to the base, wherein the slide bars are configured to receive and hold the circuit board, and wherein the cover is configured to disengage the circuit breaker from the circuit board when the cover is opened.

5. The circuit board enclosure of claim 2, wherein the circuit board includes a detector configured to detect that the cover is opened, disassembled, or disengaged from the base by determining that the circuit breaker changes to an open circuit.

6. The circuit board enclosure of claim 5, wherein the circuit board is configured to stop operating when the detector detects that the cover is opened, disassembled, or disengaged from the base.

7. The circuit board enclosure of claim 1, wherein when the circuit breaker is assembled with the base and the platform, a bottom surface of the plate of the circuit breaker is substantially of the same level as a bottom surface of the base.

8. The circuit board enclosure of claim 1, further comprising a first binding agent provided on a bottom surface of the base for attaching the circuit board enclosure to a substantially planar surface.

9. The circuit board enclosure of claim 1, further comprising a second binding agent provided on a bottom surface of the plate for attaching to a substantially planar surface.

10. The circuit board enclosure of claim 9, wherein the plate is configured such that removal of the circuit board enclosure from the substantially planar surface will damage the connection of the plate to the conductors.

11. The circuit board enclosure of claim 9, wherein the plate is electrically connected to the conductors through electrically conducting arms.

12. The circuit board enclosure of claim 9, wherein the arms are substantially perpendicular to the conductors.

13. The circuit board enclosure of claim 1, wherein the plate is made of metal.

14. The circuit board enclosure of claim 1, wherein the platform includes a substrate and a support member, wherein the support member is provided on a bottom side of the substrate, wherein the plate contacts the support member when the platform receives the circuit breaker.

15. The circuit board enclosure of claim 14, wherein the platform includes grooves on the bottom side of the substrate, the grooves being for receiving the conductors of the circuit breaker.

16. The circuit board enclosure of claim 1, wherein the bottom member of the base includes a recess for receiving the platform and the circuit breaker.

17. The circuit board enclosure of claim 1, wherein the base further includes three or more base walls, which are attached to the bottom member in a substantially perpendicular manner, and wherein the base further includes a flange portion provided on a bottom surface of the bottom member and around the opening of the bottom member.

18. The circuit board enclosure of claim 17, wherein at least two of the base walls include stoppers and at least one of the base walls includes a connecting opening.

19. The circuit board enclosure of claim 18, wherein the cover includes a top member, slide bars for receiving a circuit board, and at least one cover wall attached to the top member in a substantially perpendicular manner.

20. The circuit board enclosure of claim 19, wherein the cover further includes at least one connecting protrusion for engaging with the connecting opening of the base, wherein the at least one cover wall includes guiding protrusions for engaging with the stoppers of the base.

* * * * *